United States Patent [19]
Tung et al.

[11] Patent Number: 5,342,495
[45] Date of Patent: Aug. 30, 1994

[54] STRUCTURE FOR HOLDING INTEGRATED CIRCUIT DIES TO BE ELECTROPLATED

[75] Inventors: Francisca Tung, Los Gatos; Victor H. Okumoto, San Francisco, both of Calif.

[73] Assignee: VLSI Technology, Inc., San Jose, Calif.

[21] Appl. No.: 12,719

[22] Filed: Feb. 3, 1993

[51] Int. Cl.$^5$ .............................................. C25D 17/08
[52] U.S. Cl. ........................... 204/297 R; 204/297 W; 204/297 M
[58] Field of Search .......... 204/297 R, 297 M, 297 W

[56] References Cited

U.S. PATENT DOCUMENTS

| | | | |
|---|---|---|---|
| 3,536,594 | 10/1970 | Pritchard | 204/297 M X |
| 3,625,837 | 12/1971 | Nelson et al. | 204/297 W X |
| 4,561,960 | 12/1985 | Jeannot et al. | 204/297 W |
| 4,752,371 | 6/1988 | Kriesel et al. | 204/297 W |
| 5,024,746 | 6/1991 | Stierman et al. | 204/297 W |
| 5,171,712 | 12/1992 | Wang et al. | 437/183 |

OTHER PUBLICATIONS

Jacobs, S. L., et al., "A Multi-Chip Technology on a Stretched Polyimide Film," Polylithics, Inc., *Proceedings, NEPCON West 1990*, Anaheim, Calif., pp. 984–993, Feb. 26–31, 1990.
Johnson, T. K., "The Flexible Leaded Component (FLC): Reliable 'Bare-Chip' Packaging," UniStructure, Inc., *9th Annual IEPS Conference*, San Diego, Calif., pp. 742–753, Sep. 11–Sep. 13, 1989.
Liu, T. S., et al., "A Review of Wafer Bumping for Tape Automated Bonding," *Solid State Technology*, Mar. 1980.
Hatada, Kenzo, et al., "Bump Property for High Bondability and Reliability in Transferred Bump Tab Assembly Technology," *IMC 1988 Proceedings*, Tokyo, May 25–27, 1988.

*Primary Examiner*—Donald R. Valentine
*Attorney, Agent, or Firm*—Majestic, Parsons, Siebert & Hsue

[57] ABSTRACT

A method of forming conductive bumps on the bond pads of one or more ICs is described wherein a barrier metal layer such as TiW is first formed over the bond pads in order to passivate the surface of the one or more ICs, an electroplatable base comprising an adhesion metal layer is then formed over each of the bond pads by using a contact metal mask to screen off other portions of the IC surfaces, and a conductive bump is then formed on top of the electroplatable base by either electroplating or electroless bath techniques. A structure for holding a plurality of good IC dies while conductive bumps are being electroplated on their bond pads is also described.

8 Claims, 5 Drawing Sheets

STRUCTURE FOR HOLDING INTEGRATED CIRCUIT DIES TO BE ELECTROPLATED

BACKGROUND OF THE INVENTION

This invention relates in general to semiconductor processing techniques and in particular, to a technique for plating conductive bumps on the bond pads of one or more integrated circuit dies, and an apparatus optionally used in conjunction with the technique for holding a plurality of good integrated circuit dies while plating conductive bumps on their bond pads.

The formation of conductive bumps on the bond pads of an integrated circuit ("IC") die is especially useful in conjunction with Tape Automated Bonding ("TAB"). TAB is an effective and established means of reliably forming high density packaging. The TAB method uses a thermal bonding technique to bond inner leads formed on a film carrier to bumps typically formed on the bond pads of an IC die.

A critical process and a key element in the successful use of TAB is the proper formation of the bumps which serve to not only electrically connect the film carrier leads to the IC bond pads, but also to mechanically connect them. Several wafer processing techniques have been developed for forming bumps on the bond pads of dies preformed on a wafer, but each of these techniques has certain drawbacks. See, e.g., Liu, T. S. et al., "A Review of Wafer Bumping for Tape Automated Bonding," *Solid State Technology*, March 1980.

For example, one technique (hereinafter referred to as the "contact metal mask technique") for forming conductive bumps on the IC bond pads of dies on a wafer includes the steps of: placing a contact metal mask over the wafer being processed in such a fashion that holes in the metal mask align with IC bond pads of dies on the wafer; evaporating a layer of conductive material into the holes as well as over the exposed surface of the metal mask; and then removing the contact metal mask, leaving behind the thus formed conductive bumps on the IC bond pads of dies on the wafer. Although this technique comprises relatively simple processing steps, two problems with this technique are the added expense caused by either recovering the evaporated conductive material from the contact metal mask or wasting the conductive material by leaving it on the metal mask, and the difficulty in achieving a uniform height for the conductive bumps using the evaporation process.

Another technique (hereinafter referred to as the "photomask technique") for forming conductive bumps on the IC bond pads of dies on a wafer includes the steps of: depositing a layer of photoresist material over the active surface of the wafer; positioning an appropriately patterned photomask over the photoresist layer; exposing portions of the photoresist layer to an ultraviolet light source through portions of the photomask; removing the photomask and etching away portions of the photoresist layer deposited over the IC bond pads of the dies on the wafer; electroplating conductive material through holes formed by the etched portions of the photoresist layer; and removing the remaining photoresist layer, leaving behind the thus formed conductive bumps on the IC bond pads of the dies on the wafer. Although this technique overcomes the disadvantages of the contact metal mask technique, it adds additional processing steps through the use of a photoresist layer in forming the conductive bumps.

In addition, although wafer processing often provides certain economies of scale through the batch processing of dies, wafer processing of bumps can be inordinately expensive and its cost can exceed those economies of scale when gold ("Au") or other expensive, high purity material is used as the bump material. This is because wafer processing indiscriminately forms gold bumps on the bad dies, as well as the good dies of the wafer. The processing of large ICs is especially expensive, because of the smaller number of gross dies and the smaller percentage of good dies on the wafer being processed.

TAB, however, was developed as a packaging and mounting technique for handling large ICs with a large number of input and output ("I/O") bond pads. Thus, as ICs get larger, making TAB more attractive, the wafer processing cost of placing gold or other expensive, high purity material bumps on the IC bond pads rises exponentially with yield loss.

Alternative approaches, other than processing the bumps on the IC wafer, have therefore been pursued. One such approach is to eliminate the requirement of bumping the IC in favor of bumping the leads on the film carrier. See, e.g., Hatada, Kenzo et al., "Bump Property for High Bondability and Reliability in Transferred Bump Tab Assembly Technology," *IMC 1988 Proceedings*, Tokyo, May 25-27, 1988.

Bumping the film carrier leads, however, can also be unduly expensive for high volume production requirements since only one set of leads, corresponding to only one IC, can be fabricated at a time. Thus, although this technique solves the problem of wasting gold or other expensive, high purity bump material on bad dies, it loses the cost advantages resulting from the economies of scale provided by a batch processing fabrication method.

OBJECTS AND SUMMARY OF THE INVENTION

Accordingly, one object of the present invention is to provide an improved method for forming conductive bumps on the IC bond pads of dies on a wafer which has the advantages without any of the disadvantages of both the contact metal mask and the photomask techniques described previously.

Another object of the present invention is to provide an apparatus for cost effectively forming conductive bumps on the IC bond pads of a plurality of dies.

These and additional objects are accomplished by the various aspects of the present invention, wherein briefly stated, one aspect of the invention accomplishes one or more of these objects by a method of forming a conductive bump on a bond pad of an integrated circuit die, comprising the steps of: depositing a barrier metal layer comprising a readily oxidizable material, on the active surface of the integrated circuit die, and exposing the deposited barrier metal layer to oxygen; placing and positioning a contacting metal mask having at least one hole, against the exposed surface of the barrier metal layer in such a fashion that the at least one hole is aligned with the bond pad; sputter depositing an adhesion metal layer into the at least one hole of the contacting metal mask to form an electroplatable base on the barrier metal layer; and removing the contacting metal mask and forming the conductive bump by either electroplating it onto the electroplatable base or submerging the integrated circuit die in an electroless bath.

The method has the advantages of the contact metal mask technique in terms of simplicity, and the advantages of the photomask technique in terms of its ability to reliably control the height of the conductive bump being formed and not waste conductive bump material in the process. It is simpler than the photomask technique, because it does not require the formation of a photoresist layer, nor an exposure or etching step. It controls the height of the conductive bump being formed better than the contact metal mask technique, because it forms the conductive bumps by the more controllable process of electroplating them onto the bond pads, not evaporating conductive material onto the bond pads. Finally, it wastes less conductive material than the contact metal mask technique, because the amount of adhesion metal material incidentally deposited on the contact metal mask when forming the electroplatable bases, is far less than the amount of conductive bump material evaporated onto the contact metal mask in the contact metal mask technique. This is because the thickness of the adhesion metal layer forming the electroplatable bases is typically less than 2000 Å, whereas the height of the conductive bumps and consequently, the width of the evaporated material wasted on the contact metal mask, is typically at least 20 $\mu$m.

Preferably, the afore described barrier metal layer depositing step, the contacting metal mask positioning step, the adhesion metal layer depositing step, and the contacting metal mask removing step are conducted on a plurality of integrated circuit dies while still in wafer form. The wafer is then diced by conventional scribe and break techniques, the good dies sorted from the bad dies, and the conductive bump forming step only conducted on the sorted good dies. This approach preserves the economies of scale resulting from wafer processing the early steps of the process, while avoiding the costly material wastage resulting from bump plating bad dies.

Another aspect of the present invention is a structure for holding a plurality of integrated circuit dies while electroplating conductive bumps their bond pads. The plurality of integrated circuit dies whose bond pads are being electroplated, preferably have oxidized barrier metal layers formed on the same surfaces upon which the bond pads are formed, and adhesion metal layers (also referred to hereinafter as "electroplatable bases") selectively formed over the bond pads and the oxidized barrier metal layers over the bond pads.

Briefly, the structure of this aspect of the present invention comprises: a plurality of holding means, each holding means for holding one of the plurality of integrated circuit dies; and a plurality of contact pins, wherein each of the plurality of contact pins makes electrical contact with the barrier metal layer of one of the plurality of integrated circuit dies being held in one of the plurality of holding means.

In the preferred embodiment, the structure further includes a cavity having an inlet port, and each holding means comprises a slot adapted to hold one of the integrated circuit dies, and a channel connecting the cavity of the structure to an opening in the slot. A plurality of good integrated circuit dies are then placed against the slot openings so that their surfaces having the preformed bond pads are facing out of the slots and left exposed. The plurality of good integrated circuit dies are then held in place against the slot openings by suction forces when a vacuum source is connected to the inlet port of the cavity. Conductive bumps are then electroplated over the bond pads of the plurality of good integrated circuit dies by submerging the plurality of good integrated circuit dies being held in the structure, along with an anode, into an electroplating solution, connecting the plurality of contact pins to a common cathode, and then providing an appropriate electrical potential across the anode and common cathode for an appropriate period of time.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

FIGS. 1A–1F illustrate a simplified process for forming one or more bumps at a time on one or more bond pads of one or more integrated circuit ("IC") dies. Starting with FIG. 1A, an IC die 10 has at least one bond pad 20 formed on an active surface 15 of the IC die 10. Typically, the at least one bond pad 20 is comprised of a material such as aluminum ("Al").

Figure 1A:
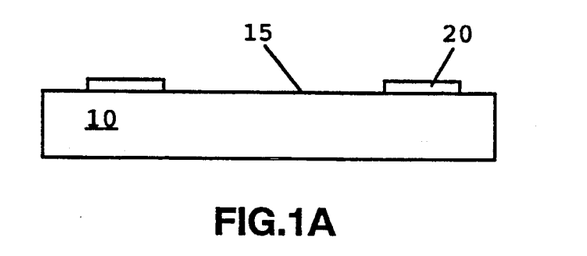
FIGS. 1A–1F illustrate a process for forming a bump on a bond pad of an integrated circuit die, utilizing aspects of the present invention.

Although a silicon nitride or polyamide passivation layer is commonly deposited over the active area of the IC die 10, this layer is not shown in order to simplify the description of the present invention. Also not shown are ink markings or other type of indicators commonly placed on good IC dies to distinguish them from bad or defective IC dies, after wafer probe testing. For the purposes of describing the invention and its preferred embodiment, however, it is assumed that such ink markings or other type of indicators have been placed on the good IC dies.

Figure 1B:
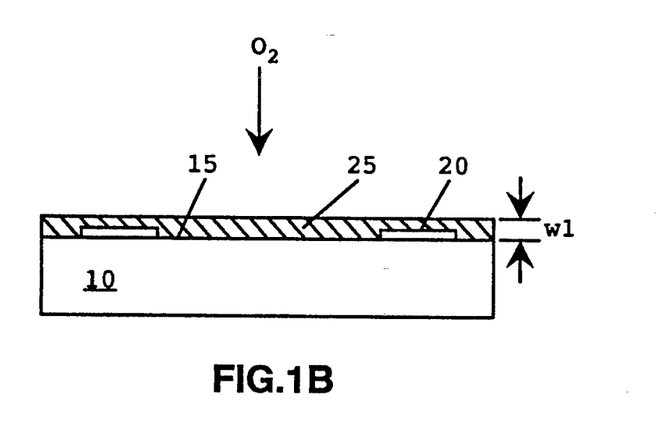

As shown in FIG.. 1B, a barrier metal layer 25 is then deposited over the active surface 15 as well as over the at least one bond pad 20 of the IC die 10. The barrier metal layer acts to both retard the conductive bump material from diffusing into the bond pad material, and to insulate portions of the active surface 15 of the IC die 10 from a subsequent electroplating process.

In order to insulate portions of the active surface 15 of the IC die 10 from a subsequent electroplating process, the material of the barrier metal layer 25 is selected such that it is readily oxidizable when exposed to oxygen ("$O_2$") For example, in the preferred embodiment of the invention, the material for the barrier metal layer 25 is preferably titungsten ("TiW") which oxidizes almost immediately when exposed to an $O_2$ rich atmosphere. The thus deposited barrier metal layer 25 is then exposed to oxygen in order to oxidize the layer. In addition to being readily oxidizable, the thickness or width, w1, of the barrier metal layer 25 is preferably less than 3000 Å, and the ink markings or other indicators which have been placed on good IC dies are preferably visible through the oxidized barrier metal layer 25.

Figure 1C:
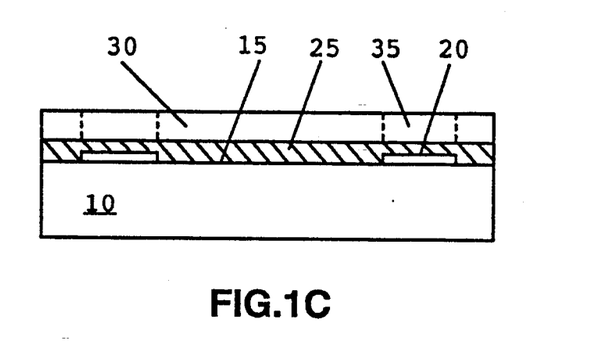
Figure 1D:
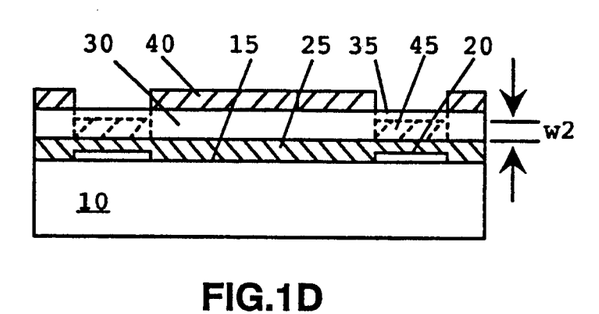

In FIG. 1C, a contacting metal mask 30 is then positioned over the active surface 15 of the IC die 10 such that each of the bond pads 20 of the IC die 10 has a hole 35 of the contacting metal mask 30 adjacent to it. An adhesion metal layer 40 is then sputter deposited, as shown in FIG. 1D, through the holes 35 of the contacting metal mask 30 to form electroplatable bases 45. The electroplatable bases 45 provide adhesion metal layers upon which conductive bumps can be formed by either electroplating them onto the electroplatable bases 45 or by submerging the IC die 10 in an electroless bath solution comprising the conductive bump material. Accordingly, the electroplatable bases 45 are preferably comprised of the same material as the subsequently formed conductive bumps to facilitate their plating. The thickness or width, w2, of the electroplatable bases 45 is preferably less than 2000 Å.

Figure 1E:
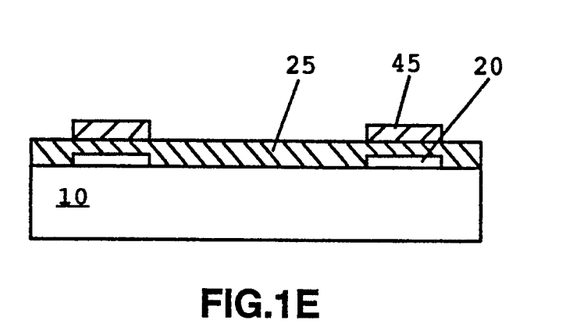
Figure 1F:
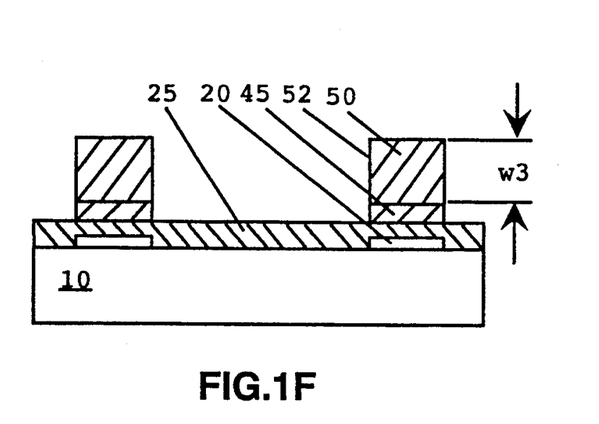

After forming the electroplatable base 45, as shown in FIG. 1E, the contacting metal mask 30 is removed; and in FIG. 1F, the conductive bumps 50 are formed on the electroplatable bases 45 by either electroplating them on or submerging the IC die 10 in an electroless bath solution comprising the conductive bump material. When electroplating, a pulsed current is preferably applied so as to form straight walls on the sides 52 of the conductive bumps 50 being formed. The material of the conductive bumps 50 can be any electroplatable material such as gold ("Au") or solder (e.g., "SnPb"), and the height, w3, of the thus formed conductive bumps 50 is preferably at least 20.0 μm.

The steps described in reference to FIGS. 1A–1E are preferably conducted by wafer processing a surface of a semiconductor wafer having a plurality of IC dies (each similar to IC die 10) preformed on the surface. As previously mentioned, the semiconductor wafer is probed before the barrier metal layer 25 deposition step (described in reference to FIG. 1B) to determine which ones of the IC dies performed on the wafer are good and which ones are bad or defective, and the good IC dies are then marked for future reference. Following the adhesion metal layer 45 deposition step (described in reference to FIG. 1E), the semiconductor wafer is then diced by conventional means such as scribing and breaking the wafer. The good dies are then sorted from the bad dies by the markings which remain visible through the thin barrier metal layer 25. Thereafter, the conductive bump 50 forming step (described in reference to FIG. 1F) is conducted only upon good IC dies.

Thus, by wafer processing the barrier metal layer 25 and adhesion metal layer 45 deposition steps, certain economies of scale resulting from such batch processing is realized. Further, although it might be feasible to form the barrier metal layer 25 on individual dies, it would be commercially impractical to attempt to mask and sputter deposit the adhesion metal layer 45 on individual dies.

Wafer processing the conductive bumps onto the bond pads of the IC dies, however, is wasteful. As previously mentioned, one reason is because the expensive bump material is then formed and consequently wasted, upon the bond pads of bad IC dies. Preferably, prior to the conductive bump 50 forming step (described in reference to FIG. 1F), the wafer is diced and the conductive bumps 50 are only formed on the good IC dies.

Figure 2:
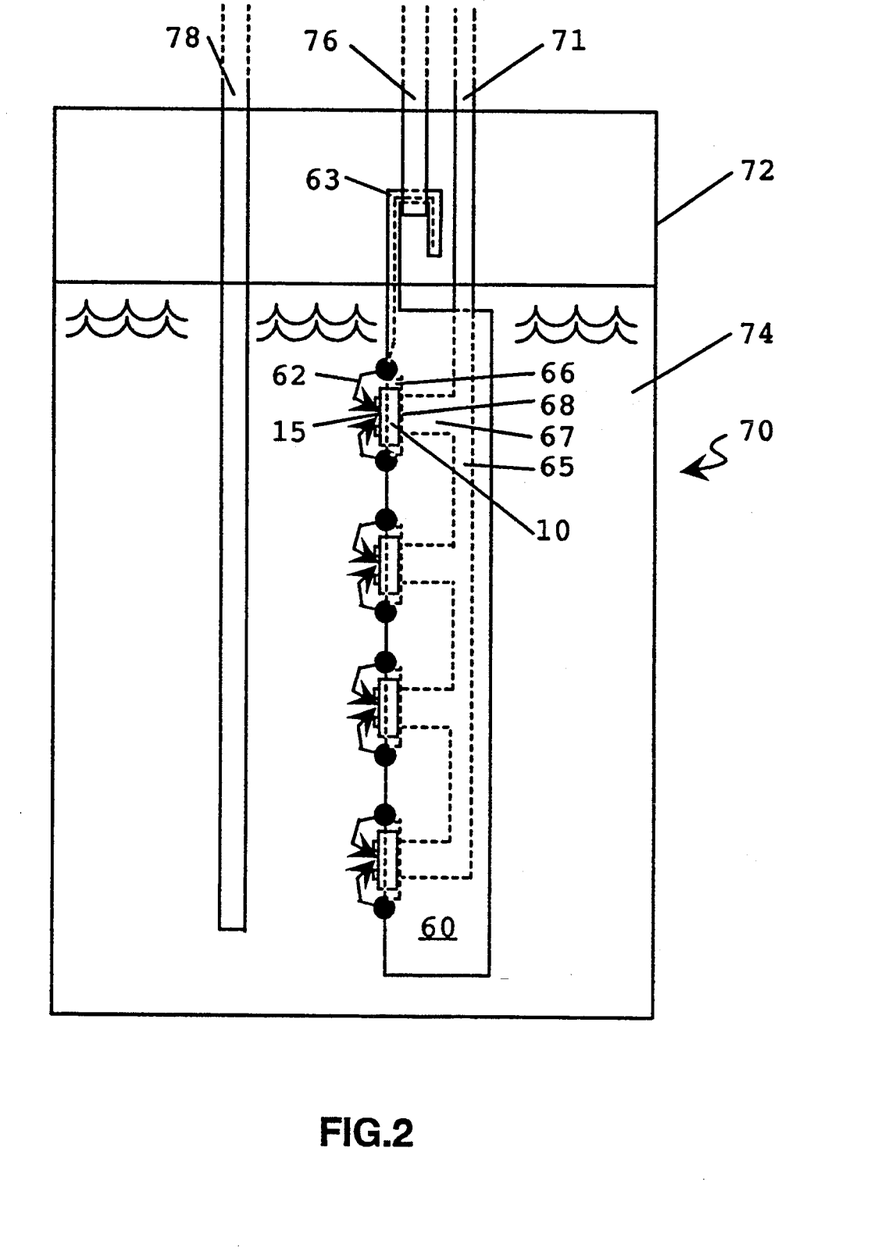
FIG. 2 illustrates an apparatus for plating conductive bumps on a plurality of good integrated circuit dies, utilizing aspects of the present invention.

FIG. 2 illustrates a preferred apparatus 70 for batch processing the formation of conductive bumps on a plurality of good IC dies. The good IC dies (e.g., IC die 10; and hereafter also referred to collectively as "IC dies 10") are placed and held in slots 66 of a structure 60, with their active surfaces 15 facing outward from the slots 66 so as to be exposed. Contact pins 62 act to both hold the good IC dies 10 in place in the slots 66 and make electrical connections to their barrier metal layers 25. The contact pins 62 are then connected to a common cathode 76 by internally connecting them within the structure 60 via internal electrical connections (shown in dotted lines in FIG. 2) to a handle 63 of the structure 60, which hooks onto the common cathode 76.

The structure 60 is then submerged into a container 72 holding an aqueous electroplating solution 74. The electroplating solution 74 comprises the conductive bump material which is to be plated onto the bond pads of the good IC dies 10. An anode 78 is also submerged into the electroplating solution 74. The conductive bumps are then electroplated onto the electroplatable bases 45 over the bond pads 20 of the good IC dies 10 by providing an appropriate electrical potential across the anode 78 and the common cathode 76 for an appropriate time period. The oxidation previously formed on the barrier metal layer 25 as well as the type of material forming the barrier metal layer 25, acts to prevent conductive material from electroplating onto the barrier metal layer 25.

Figure 3A:
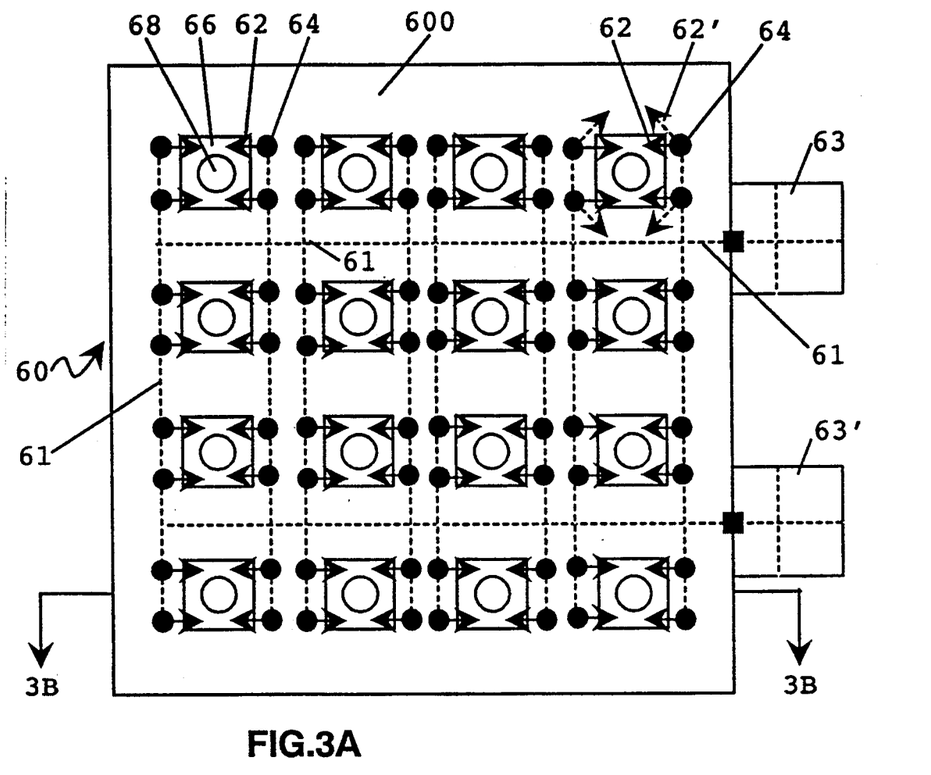
FIGS. 3A–B illustrate a top plan and a cross-sectional side view, respectively, of a preferred structure for holding a plurality of good dies while plating conductive bumps on their bond pads, utilizing aspects of the present invention.
Figure 3B:
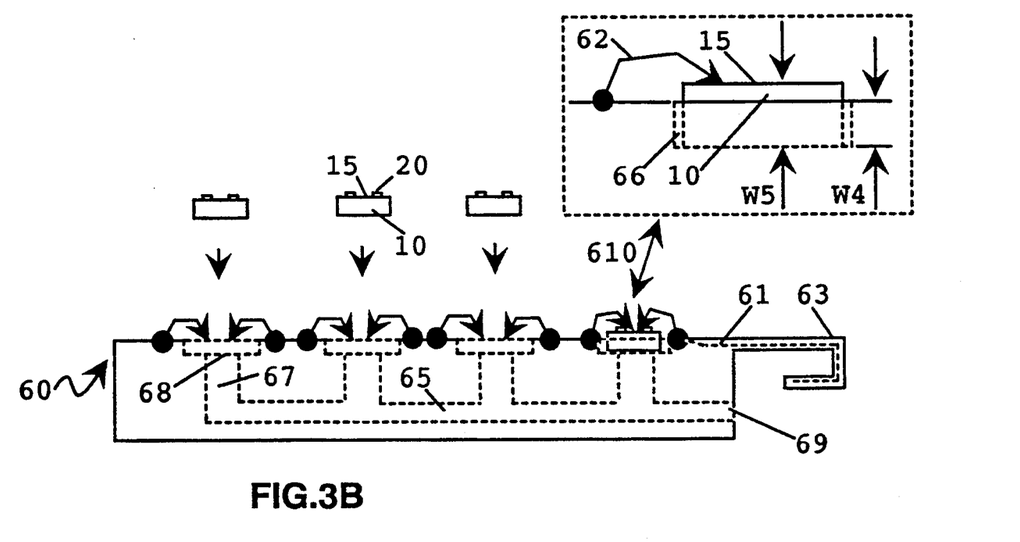

FIGS. 3A–B illustrate a top plan view and a cross-sectional side view, respectively, of the preferred embodiment of the structure 60 shown in FIG. 2. A top surface 600 of the structure 60 is shown having a plurality of slots 66 (also referred to herein as "die cavities") formed on it. A plurality of IC dies 10 are placed into the slots 66 with their active surfaces 15 facing outward. When placing each IC die 10 into its respective slot 66, contact pins 62 are first rotated about their swivel bases 64 (as illustrated by dotted contact pin 62') so that the IC die 10 can be placed in the slot 66, then rotated back to their original positions (illustrated by solid contact pin 62) to help hold the IC die 10 in place, and to make electrical contact with the barrier metal layer 25 on the IC die 10 being held in its respective slot 66.

Since the barrier metal layer 25 extends over the active surface 15 of the IC die 10, accurate positioning of the IC die 10 in the slot 66 is not necessary and consequently, the length and width dimensions of the slot 66 are not critical with respect to those of the IC die 10, as long as they allow the IC die 10 to comfortably reside in the slot 66. Preferably, however, the depth W4 (e.g., 10–15 mils) of each die cavity 66 is less than the thickness W5 (e.g., 19 mils) of the IC die 10 to ensure that good electrical contact is made between the barrier metal layer 25 of the IC die 10 and the spring or pressure loaded contact pin 62. The slots 66 can be formed, for example, by standard machining or photolithography techniques.

The common cathode connection 76 is connected to each of the contact pins 62, for example, through internal connections 61 (shown as dotted lines in FIG. 3A) formed within the structure 60 and one or more handles 63 also connected to the internal connections 61, which hook on to the common cathode connection 76. Thus, in the preferred embodiment, the common cathode connection 76 not only provides an electrical potential source, but also provides mechanical support for holding the structure 60 in the container 72. Although all of the contact pins 62 are shown connected together in FIG. 3A, this is not necessary. For example, if the structure 60 has two handles, half of the contact pins 62 on the structure 60 could be connected to one handle (e.g., 63 in FIG. 3A) and the other half of the contact pins 62 could be connected to the other handle (e.g., 63' in FIG. 3A). The two handles would then both be hooked onto the common cathode connection 76 (refer to FIG. 2), and the common cathode connection 76 would accordingly be electrically connected to each of the contact pins 62 of the structure 60.

Although the contact pins 62 help to hold the plurality of IC dies 10 in the slots 66, the primary means of holding the IC dies 10 in the slots 66 is vacuum suction. Referring now to FIG. 3B, each of the slots 66 has a backside opening 68 connected via a channel 67 to a common cavity or tunnel area 65 formed within the structure 60. Vacuum suction is provided to the common cavity area 65 through an inlet port 69 which in turn is connected to a vacuum source (not shown) by a vacuum line (e.g., line 71 in FIG. 2) so that suction holds each of the IC dies 10 in place during electroplating.

Figure 4A:
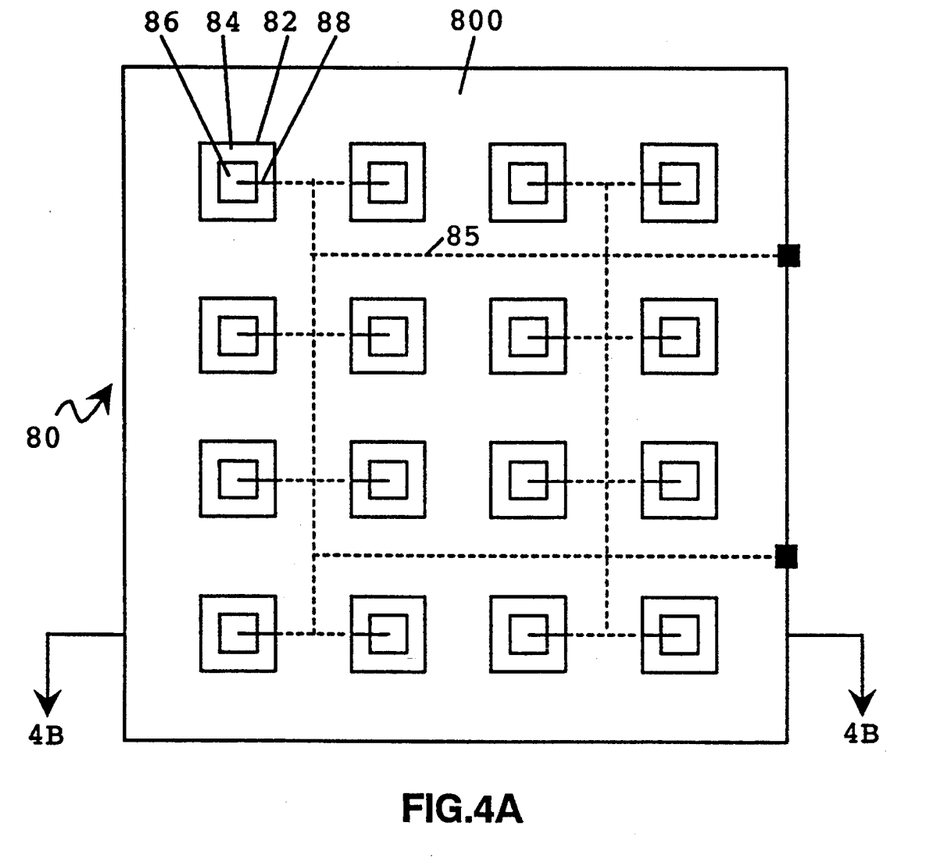
FIGS. 4A–B illustrate a top plan and a cross-sectional side view, respectively, of an alternative structure for holding a plurality of good dies while plating conductive bumps on their bond pads, utilizing aspects of the present invention.
Figure 4B:
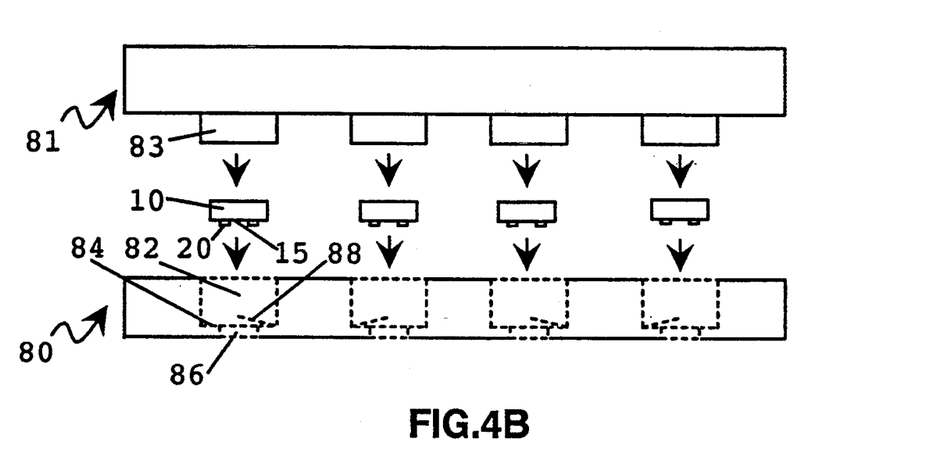

FIGS. 4A–B illustrate a top plan view and a cross-sectional side view, respectively, of an alternative embodiment 80 performing the same function as the structure 60 shown in FIG. 2. A top surface 800 of the structure 80 is shown having a plurality of slots 82 (also referred to herein as "die cavities") formed on it. In this embodiment, the contact pins 88 do not need to be rotated in order for the slot 82 to receive an IC die 10. The contact pins 88 extend from ledge areas 84 which are formed on the backsides of the slot 82 around an opening 86. Each IC die 10 is then placed into one of the slots 82 with its active surface 15 facing inward towards the slot 82. With the plurality of IC dies 10 thus oriented, the spring loaded contact pins 88 automatically make electrical contact with the oxidized barrier metal layers 25 formed over the active surfaces 15 of the plurality of IC dies 10.

The IC dies 10 are then held in the slots 82 by positioning and securing a back plate 81 having a plurality of spring loaded protrusions 83 in such a fashion that each spring loaded protrusion 83 is positioned behind and makes contact with one of the IC die 10 preinserted into one of the slots 82. The back plate 81 is then secured, for example, by clamping means (not shown), to the structure 80. Thus, the back plate 81 eliminates the necessity of forming a vacuum cavity within the structure 80, and eliminates the necessity of hooking up and supplying a vacuum source to the vacuum cavity, such as required in the preferred embodiment of the invention.

When submerging the structure 80 into the container 72, the aqueous electroplating solution 74 comes in contact with the barrier metal layer 25 on each of the IC dies 10 through the back side slot opening 86. Consequently, by using a similar apparatus as shown in FIG. 2, the conductive bumps 50 can be electroplated onto preformed electroplatable bases 45 formed on each of the IC dies 10. Although not shown in FIGS. 4A–B, a handle similar to that shown in FIGS. 3A–B could also be constructed and electrically connected to each of the contact pins 88 as described in reference to the handle 63 as shown in those figures, and thereupon hook onto a common cathode connection as described in reference to the common cathode connection 76 as shown in FIG. 2.

Although the various aspects of the present invention have been described with respect to a preferred embodiment, it will be understood that the invention is entitled to full protection within the full scope of the appended claims. In addition, it is to be understood that wherever electroplating is referred to in the claims, the same result can generally be accomplished by submerging the unit being acted upon in an electroless bath of the appropriate conductive bump material and is accordingly, contemplated to be protected in the claims as such.

What is claimed is:

1. A structure for holding a plurality of individual integrated circuit die while electroplating conductive bumps over bond pads of said plurality of individual integrated circuit die, wherein each of said plurality of individual integrated circuit die has a surface upon which bond pads have been formed, and upon said surface an oxidized barrier metal layer has been formed, and upon said oxidized barrier metal layer an adhesion metal layer has been selectively formed over said bond pads of said individual integrated circuit die, said structure comprising:

a plurality of holding means, each holding means for holding one of said plurality of individual integrated circuit die; and a plurality of contact pins, wherein each of said plurality of contact pins is adapted to make electrical contact with the barrier metal layer of one of said plurality of individual integrated circuit die being held in one of said plurality of holding means.

2. The structure of claim 1, wherein at least two of said plurality of contact pins are electrically connected together.

3. A structure for holding a plurality of integrated circuit die while electroplating conductive bumps over bond pads of said plurality of integrated circuit die, wherein each of said plurality of integrated circuit die has a surface upon which bond pads have been formed, and upon said surface an oxidized barrier metal layer has been formed, and upon said oxidized barrier metal layer an adhesion metal layer has been selectively formed over said bond pads of said integrated circuit die, said structure comprising:

a plurality of holding means, each holding means for holding one of said plurality of integrated circuit die;

a plurality of contact pins, wherein each of said plurality of contact pins is adapted to make electrical contact with the barrier metal layer of one of said plurality of integrated circuit die being held in one of said plurality of holding means, wherein at least two of said plurality of contact pins are electrically connected together and;

a hook which is electrically connected to said at least two contact pins which are electrically connected together.

4. A structure for holding a plurality of integrated circuit die while electroplating conductive bumps over bond pads of said plurality of integrated circuit die, wherein each of said plurality of integrated circuit die has a surface upon which bond pads have been formed, and upon said surface an oxidized barrier metal layer has been formed, and upon said oxidized barrier metal layer an adhesion metal layer has been selectively formed over said bond pads of said integrated circuit die, said structure comprising:

a plurality of holding means, said plurality of holding means comprises a plurality of slots, each holding means for holding one of said plurality of integrated circuit die, wherein each slot is adapted to hold one of said plurality of integrated circuit die; and a plurality of contact pins, wherein each of said plurality of contact pins is adapted to make electrical contact with the barrier metal layer of one of said plurality of integrated circuit die being held in one of said plurality of holding means.

5. The structure of claim 4, further comprising a cavity having an inlet port, wherein said plurality of holding means further comprises a plurality of channels, each of said plurality of channels connecting said cavity to an opening in one of said plurality of slots, so that an integrated circuit die placed against said opening is held in place by suction in said one slot when a vacuum source is connected to said inlet port of said cavity.

6. The structure of claim 4, further comprising a back plate, wherein each of said plurality of slots is shaped as a hollow parallelepiped having an open face for receiving one of said integrated circuit die and an opposite face with a ledge area formed around a center opening for receiving an electroplating solution through said center opening, and wherein said plurality of holding means further comprises a plurality of protrusions formed on said back plate which are adapted to fit in said plurality of slots so that a plurality of integrated circuit die having surfaces with bond pads preformed on said surfaces can be placed against said ledge areas of said slots with said surfaces facing said center openings, and held in place by positioning and holding said back plate in such a fashion that each of said plurality of protrusions is positioned in one of said plurality of slots and pressed against a back surface of an integrated circuit die when placed in said one slot.

7. The structure of claim 6, wherein the ledge area of each of said plurality of slots has at least one of said plurality of contact pins extending out of said ledge area, so that said contact pin makes contact with said barrier metal layer on said surface of said integrated circuit die when said surface is placed against said ledge area.

8. The structure of claim 6, wherein each of said plurality of protrusions acts as a spring against the back surface of the integrated circuit die which said protrusion is pressed against.

* * * * *